United States Patent [19]

Suwa et al.

[11] Patent Number: 4,833,654

[45] Date of Patent: May 23, 1989

[54] METHOD OF AND CIRCUITRY FOR GENERATING STAGGERED RESTORE TIMING SIGNALS IN BLOCK PARTITIONED DRAM

[75] Inventors: Makoto Suwa; Hideto Hidaka, both of Hyogo, Japan

[73] Assignee: Mitsubishi Denki Kabushiki Kaisha, Tokyo, Japan

[21] Appl. No.: 144,382

[22] Filed: Jan. 15, 1988

[30] Foreign Application Priority Data

May 27, 1987 [JP] Japan .................. 62-134244

[51] Int. Cl.⁴ .............................. G11C 7/00
[52] U.S. Cl. ................... 365/210; 365/203; 365/189.08
[58] Field of Search ............ 365/203, 210, 230, 233, 365/205, 149, 189

[56] References Cited

U.S. PATENT DOCUMENTS 4,734,890 3/1988 Miyatake et al. .................. 365/210
4,736,343 4/1988 Hidaka et al. ...................... 365/203

OTHER PUBLICATIONS

R. A. Kertis et al., "A 60ns 256K×1 Bit DRAM Using LD Technology and Double-Level Metal Interconnection", IEEE Journal of Solid-State Circuits, vol. SC-19, No. 5, Oct., 1984, pp. 585-590.

R. A. Kertis et al., "A 59ns 256K DRAM Using LD Technology and Double Level Metal", 1984, IEEE International Solid-State Circuits Conference, Feb. 22, 1984.

Primary Examiner—Joseph A. Popek
Attorney, Agent, or Firm—Lowe, Price, LeBlanc, Becker & Shur

[57] ABSTRACT

A memory cell array is divided into four blocks. A sense amplifier and a restore circuit and provided in each of the blocks. The sense amplifier operates by a sense amplifier driving signal and the restore circuit operates by a restore circuit driving signal. A driving signal generating circuit generates two restore circuit driving signals at different timing. In order to generate the restore circuit driving signals, a block selecting signal, a block non-selecting signal, a sense amplifier driving signal and two dummy bit lines are used. Restoring operation in a block selected by the block selecting signal and restoring operation in a non-selected block are performed at different timing by the above described restore circuit driving signals.

8 Claims, 10 Drawing Sheets

METHOD OF AND CIRCUITRY FOR GENERATING STAGGERED RESTORE TIMING SIGNALS IN BLOCK PARTITIONED DRAM

BACKGROUND OF THE INVENTION
1. Field of the Invention

The present invention relates to a block partitioned dynamic random access semiconductor memory array, and more particularly, to a method of and circuitry for generating timing signals to stagger restoration therein for reducing peak current consumption of the array.

2. Description of the Prior Art

In the conventional dynamic type MOS.RAM (metal oxide semiconductor.random access memory), consumed current in an active cycle is not averaged, so that several sharp peaks appear in one cycle. Referring now to FIGS. 1 to 3, such a conventional example is described.

FIG. 1 is a block diagram showing a structure of the conventional Block Partitioned dynamic type MOS.-RAM (1M bits). The Block Partitioned DRAM is described in, for example, "A 60ns 256K×1 Bit DRAM Using $LD^3$ Technology and Double-Level Metal Interconnection", IEEE Journal of Solid-States Circuits, Vol. SC-19. No. 5, October 1984, p. 585. In FIG. 1, a memory cell array MA is divided into, for example, four blocks #1 to #4. The blocks comprise column decoders CD, respectively. The blocks are provided with a common row decoder RD. Each of the blocks in the memory cell array MA is accessed by address signals A0 to A9 (including row addresses RA0 to RA9 and column addresses CA0 to CA9) inputted externally in a time divisional manner. The address signals A0 to A9 are stored in advance in an address buffer AB and then, applied to the row decoder RD and the column decoders CD. The row address RA9 is applied to each of the blocks separately from the other address signals. The row address RA9 selects two blocks where data are to be read or written. For example, when RA9 equals 0, the blocks #1 and #3 are selected. When RA9 equals 1, the blocks #2 and #4 are selected. The row address signals RA0 to RA8 other than RA9 are applied to the row decoder RD, so that any of word lines in each of the blocks is selected. Thus, if the address signals A0 to A9 are externally inputted, any word line in each of the blocks is selected and rises, irrespective of whether or not the particular block is selected by the row address signal RA9. More specifically, a single corresponding word line rises in each of the blocks #1, #2, #3 and #4. This is because a memory cell connected to each of the word lines is refreshed even in the block where data are neither read out nor written. An $\overline{RAS}$ buffer RB outputs various control signals WL, $\Phi_S$, $\overline{\Phi_S}$ in response to a row address strobe signal $\overline{RAS}$ externally inputted and applies the same to the memory cell array MA. A $\overline{CAS}$ buffer CB applies to a data input buffer DIB and a data output buffer DOB a signal for controlling input/output of data in response to a column address strobe signal $\overline{CAS}$ externally inputted. The data input buffer DIB and the data output buffer DOB are connected to the blocks #1 to #4 through a pair of data lines I/O and $\overline{I/O}$. The data input buffer DIB temporarily stores data Din externally inputted. The data output buffer DOB temporarily stores data read out from the memory cell array MA and outputs the same to the exterior as output data Dout. A $\overline{WE}$ buffer WB controls a read mode and a write mode in each of the data input buffer DIB and the data output buffer DOB in response to a write enable signal $\overline{WE}$ externally inputted.

FIG. 2 is a diagram showing a structure of any of the blocks #1 to #4 shown in FIG. 1. In FIG. 2, a plurality of word lines 1 and a plurality of pairs of bit lines BL and $\overline{BL}$ (only a pair of bit lines is illustrated in FIG. 2) are provided orthogonal to each other. Memory cells MC each comprising, for example, a single MOSFET and a single capacitor are arranged at intersections of each of the word lines 1 and each of the bit line pairs BL and $\overline{BL}$. Each of the word lines 1 is connected to word line driving circuit 2. The word line driving circuit 2 raises the potential on the word line 1 selected by the row decoder RD when the word line driving signal WL is applied from the $\overline{RAS}$ buffer RB shown in FIG. 1. A restore circuit RS comprising two P channel MOSFETs and a sense amplifier SA comprising two N channel MOSFETs are provided for each of the bit line pairs BL and $\overline{BL}$. The sense amplifier SA detects the potentials on the bit lines BL and $\overline{BL}$ after a memory cell MC is selected and causes the potential on the bit line at a low level to be a ground level. The restore circuit RS pulls up the potential at a high level to a power-supply voltage Vcc. The restore circuits RS each provided for each of the bit line pairs are connected to each other and connected to the power-supply voltage Vcc through a P channel MOSFET 3. The P channel MOSFET 3 has a gate electrode receiving a restore circuit driving signal $\overline{\Phi_S}$ from the $\overline{RAS}$ buffer RB. The restore circuits RS each provided for each of the bit line pairs and the P channel MOSFET 3 constitute a restoring system. In addition, the sense amplifiers SA each provided for each of the bit line pairs are connected to each other and connected to a ground through an N channel MOSFET 4. The N channel MOSFET 4 has a gate electrode receiving the sense amplifier driving signal $\Phi_S$ from the $\overline{RAS}$ buffer RB. The sense amplifiers SA each provided for each of the bit line pairs and the N channel MOSFET 4 constitute a sense amplifier system. Furthermore, one of the bit lines BL in each of the bit line pairs is connected to the data line I/O through an N channel MOSFET 5 and the other bit line $\overline{BL}$ is connected to the data line $\overline{I/O}$ through an N channel MOSFET 6. Each of the N channel MOSFETs 5 and 6 has a gate electrode receiving a corresponding decoded output from the column decoder CD.

Furthermore, the bit lines BL and $\overline{BL}$ are connected to a bit line precharging line 9 through N channel MOSFETs 7 and 8, respectively. A voltage $V_{BL}$ which is a half of the power supply voltage Vcc is applied to the bit line precharging line 9. Each of the MOSFETs 7 and 8 has a gate terminal receiving a precharge clock $\Phi_{EQ}$. In addition, the precharge clock $\Phi_{EQ}$ is also applied to a gate terminal of an N channel MOSFET 10 interposed between the bit lines BL and $\overline{BL}$.

FIG. 3 is a timing chart for explaining operation of the conventional circuit shown in FIGS. 1 and 2. Referring now to FIG. 3, description is made on operation in one cycle of the above described conventional circuit.

The row address strobe signal $\overline{RAS}$ falls, so that an active period is started. The row address strobe signal $\overline{RAS}$ defines a non-active period and the active period. The word line 1 specified by the row addresses RA0 to RA8 rises and a signal voltage corresponding to memory cell data appears on the bit line pairs BL and $\overline{BL}$. Thereafter, the sense amplifier driving signal $\Phi_S$ rises, so that the sense amplifier system operates. Therefore, the potential on the bit line at a lower potential, of the bit line pairs BL and $\overline{BL}$ becomes a ground potential. Thereafter, the restore circuit driving signal $\Phi_S$ falls, so that the restoring system operates. Therefore, the potential on the bit line at a higher potential, of the bit line pairs BL and $\overline{BL}$ is pulled up to the power-supply voltage Vcc. Thereafter, the column decoder CD operates in response to the column addresses CA0 to CA9 latched at the falling time of the column address strobe signal $\overline{CAS}$. As a result, the selected bit line pairs BL and $\overline{BL}$ are connected to the pair of data lines I/O and $\overline{I/O}$, so that data are inputted or outputted. When one cycle is completed and the row address strobe signal $\overline{RAS}$ rises, the selected word line falls and the MOSFETs 7, 8 and 10 are turned on by a precharge signal $\Phi_{EQ}$, so that each of the bit line pairs BL and $\overline{BL}$ is precharged to be the voltage $V_{BL}$.

Consumed current Icc applied from a power supply is now considered based on operation in such one cycle. As shown in FIG. 3, the consumed current Icc has five peaks P1 to P5. The peaks P1 to P5 are as follows:

P1: consumed current at the time of generating a clock of a $\overline{RAS}$ system P2: bit line charging current at the time of generating a clock in sensing operation and at the time of restoring operation P3: consumed current at the time of generating a clock of a $\overline{CAS}$ system P4: consumed current at the time of generating a clock of a $\overline{RAS}$ system P5: consumed current at the time of generating a clock of a $\overline{CAS}$ system.

More particularly, in a recent system that a peripheral circuit portion comprises a CMOS (complementary metal oxide semiconductor), the row decoder RD and the column decoder CD comprise static circuits and bit lines are precharged to the potential of Vcc, the peak P2 is much larger than the other peaks, which put a load on a power supply system.

Since the conventional semiconductor memory device has the above described structure, the peak value of the consumed current generated at the time of restoration is large, so that a load on the power supply system is large. Thus, particularly, in a DRAM having large capacitance such as 1M bit, the size of the power supply system is increased and the calorific value is increased.

A method for reducing peak current consumption at the time of precharging bit lines is described in the above described document and an article "A 59ns 256K DRAM Using LD³ Technology and Double Level Metal" ISSCC '84 Dig. Tech Papers, pp. 96. However, the method fails to reduce peak current consumption at the time of restoring operation.

Meanwhile, one of the inventors of the present invention has proposed that restoring operation is started at different timing with a predetermined time difference every block to reduce peak current consumption caused at the time of restoring operation, in a co-pending U.S. application Ser. No. 929,371, filed Nov. 12, 1986.

SUMMARY OF THE INVENTION

An object of the present invention is to solve the above described problems and to provide a dynamic type semiconductor memory device capable of reducing peak current consumption.

Another object of the invention is to reduce peak current consumption in a block partitioned dynamic random access memory array.

A further object is to reduce peak current consumption during restoration in a block partitioned dynamic random access memory by generating timing signals for staggering restoration of selected and non-selected blocks of the array.

A still further object is to reduce peak current consumption during restoration in a block partitioned dynamic random access memory by generating timing signals for staggering restoration of selected and non-selected blocks using dummy bit lines respectively to the selected and non-selected blocks of the array.

The semiconductor memory device according to the present invention comprises a plurality of word lines, a plurality of pairs of bit lines, a plurality of memory cells located at intersections of the word lines and the bit lines, a sense amplifier for amplifying voltage between each of the bit line pairs and restoring means for further amplifying the voltage between each of the bit line pairs, each of the plurality of memory cells being divided into a plurality of blocks.

The semiconductor memory device comprises block selecting means for generating a block selecting signal for selecting the blocks and a block non-selecting signal, sense amplifier driving means for generating a sense amplifier driving signal for operating the sense amplifier, restore driving means for generating a restore driving signal for operating the restoring means after generation of the sense amplifier driving signal, and a pair of signal lines.

More particularly, the restore driving means comprises first generating means, first signal line driving means, second generating means and second signal line driving means. The first generating means is responsive to the sense amplifier driving signal, the block selecting signal and the potential on one signal line of the signal lines for generating a first restore driving signal for operating restoring means in a block designated by the block selecting signal. The first signal line driving means is responsive to the first restore driving signal for driving the other signal line of the signal lines. The second generating means is responsive to the sense amplifier driving signal, the block non-selecting signal and the potential on the other signal line for generating a second restore driving signal for operating restoring means in a block designated by the block non-selecting signal. The second signal line driving means is responsive to the second restore driving signal for driving one signal line of the signal lines.

According to the present invention, a restore driving signal in the selected block and a restore driving signal in the non-selected block are separately generated. The restore driving signal in the selected block is generated by the first generating means in response to the sense amplifier driving signal, the block selecting signal and the potential on one of the signal lines. The restore driving signal in the non-selected block is generated by the second generating means in response to the sense amplifier driving signal, the block non-selecting signal and the potential on the other signal line. Therefore, the restore driving signals in the selected block and the non-selected block are generated at different timing and consumed current is dispersed in the direction of the time base, so that peak current consumption is decreased.

As described in the foregoing, according to the present invention, peak current consumption can be very effectively decreased without preventing memory operation.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
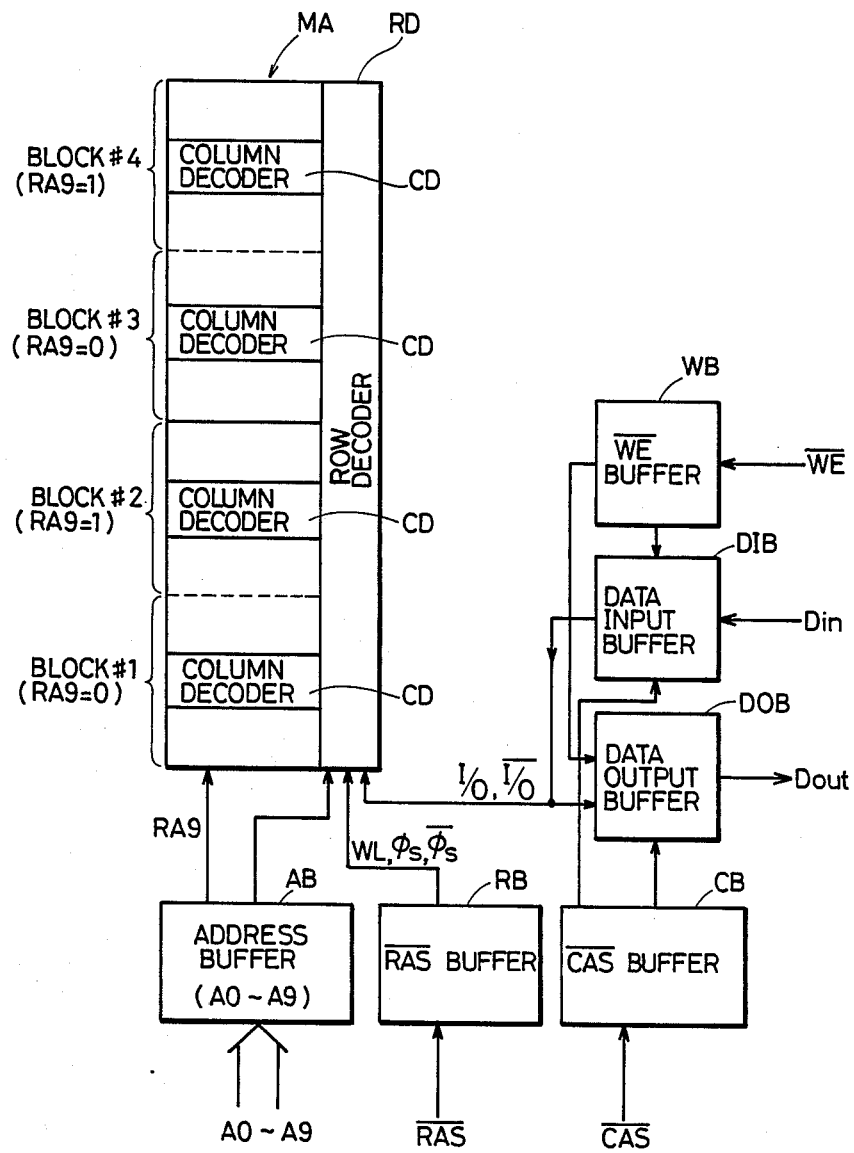
FIG. 1 is a block diagram showing a schematic structure of a conventional semiconductor memory device.
Figure 2:
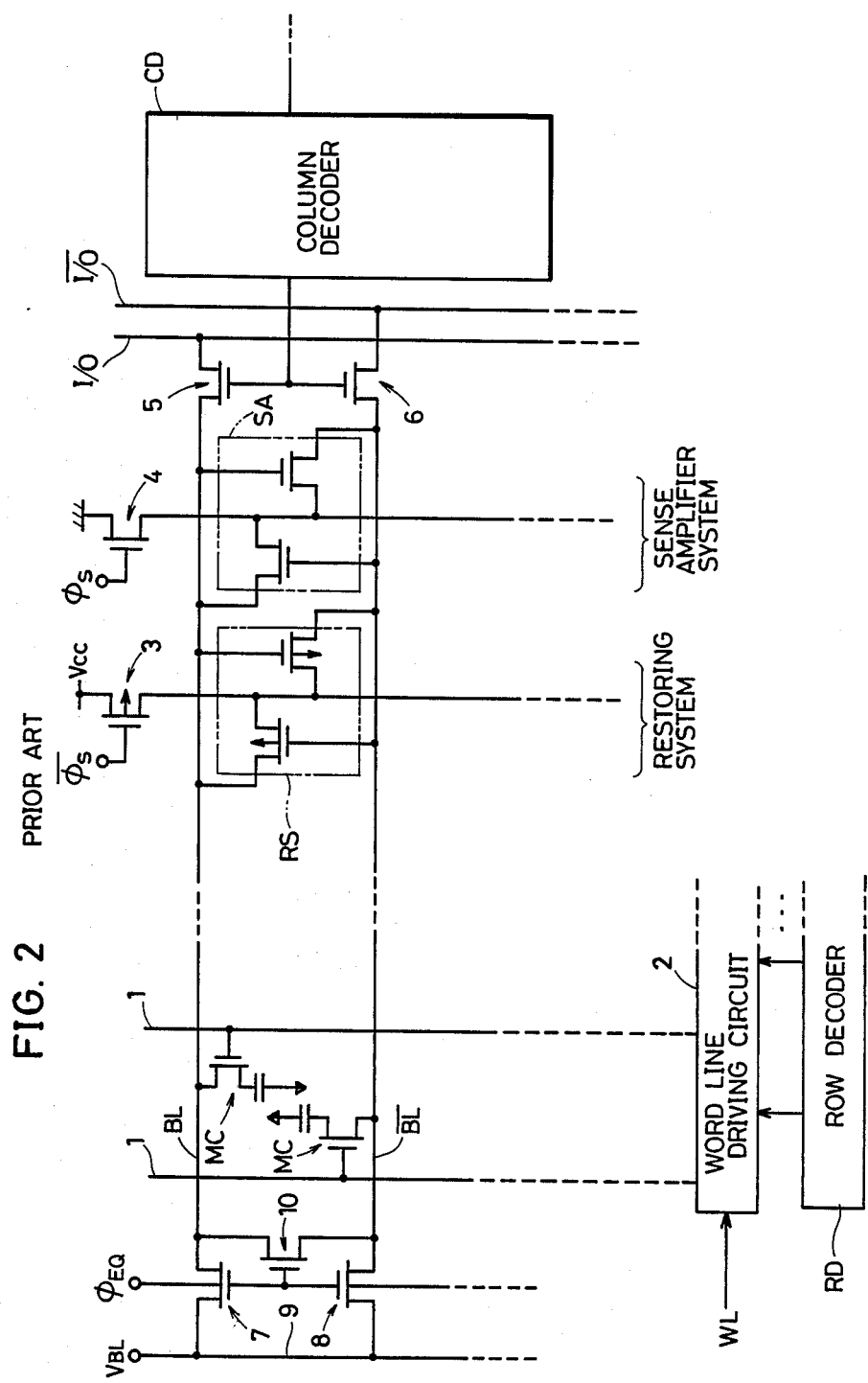
FIG. 2 is a circuit diagram showing a structure of any of blocks #1 to #4 shown in FIG. 1.
Figure 3:
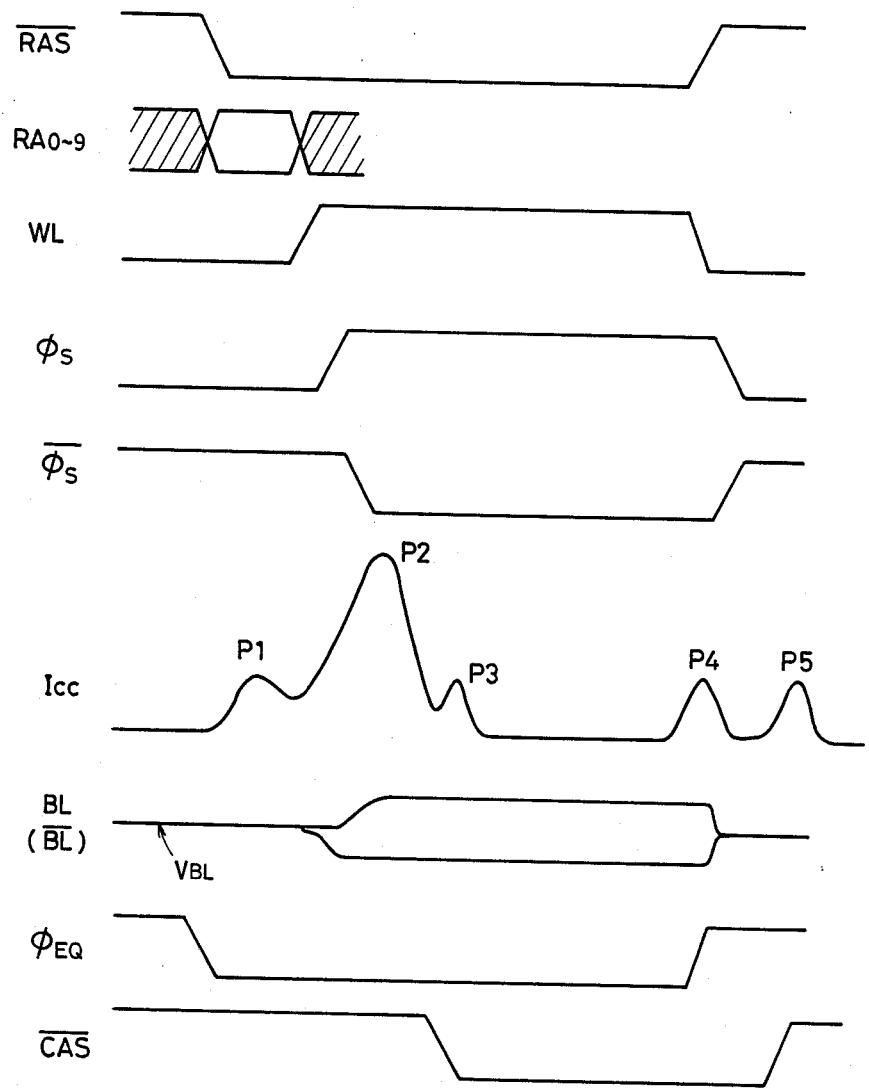
FIG. 3 is a timing chart for explaining operation according to an embodiment shown in FIGS. 1 and 2.
Figure 4:
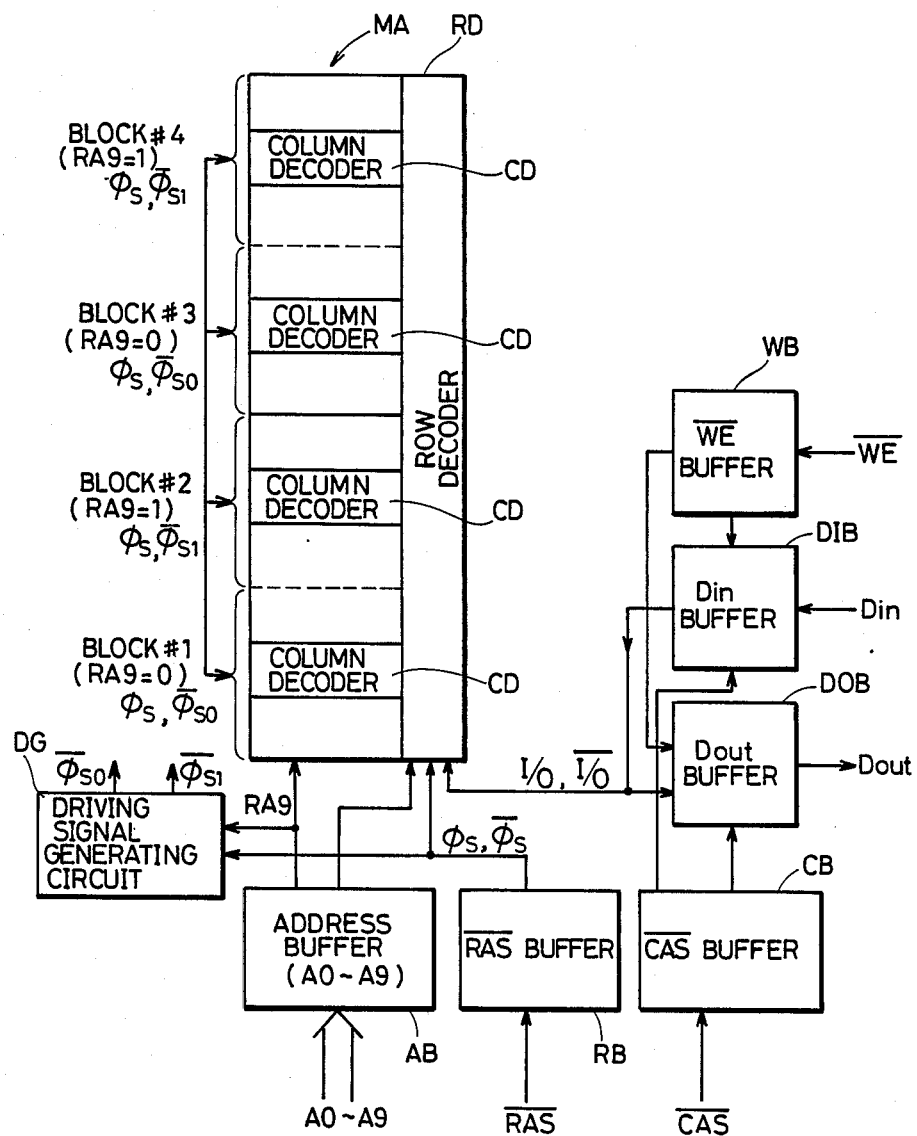
FIG. 4 is a block diagram showing a schematic structure of a semiconductor memory device according to an embodiment of the present invention.
Figure 5:
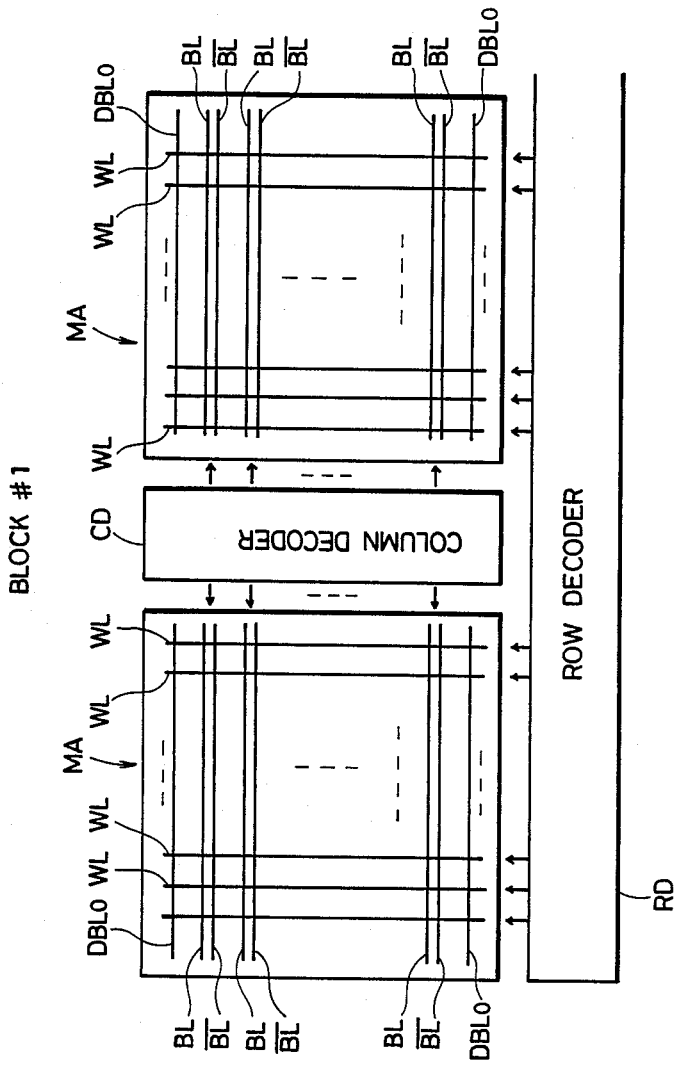
FIG. 5 is a diagram showing a schematic structure of a single block included in a memory cell array shown in FIG. 4.
Figure 6:
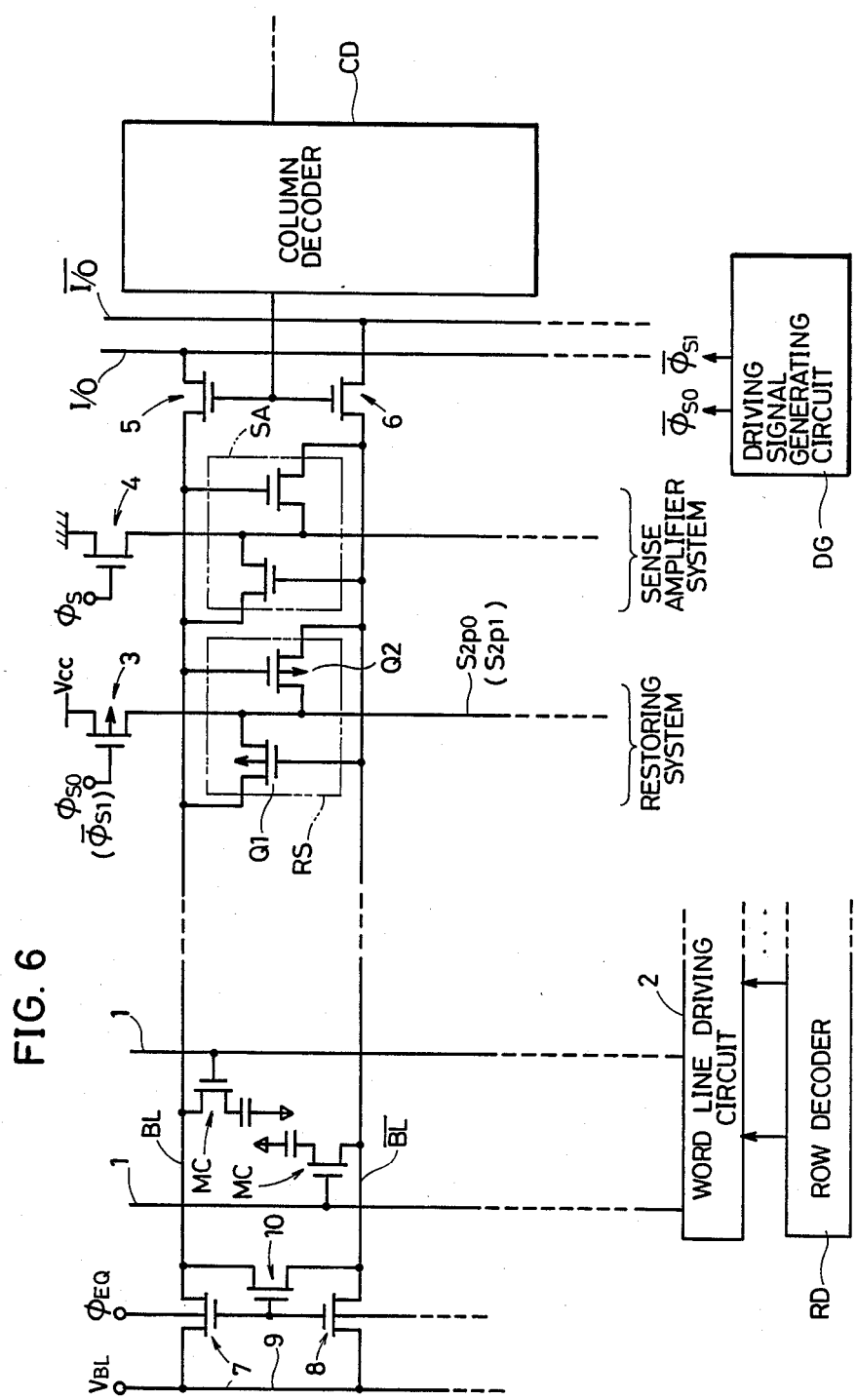
FIG. 6 is a diagram showing a circuit structure of any of blocks #1 to #4 shown in FIG. 4.

FIG. 4 is a block diagram showing a schematic structure of a semiconductor memory device according to an embodiment of the present invention. FIG. 5 is a schematic diagram showing any of divided blocks in a memory cell array MA shown in FIG. 4. FIG. 6 is a circuit diagram showing a portion of a pair of bit lines included in the memory cell array. The present embodiment has the same structure as that of the conventional example shown in FIGS. 1 and 2, except for the following. The corresponding portions have the same reference numerals and hence, description thereof is omitted.

The present embodiment is characterized in that a restore circuit driving signal is divided into two signals of $\overline{\Phi_{S0}}$ and $\overline{\Phi_{S1}}$ and the restore circuit driving signals $\overline{\Phi_{S0}}$ and $\overline{\Phi_{S1}}$ are generated at different timing with a predetermined difference of time period by a driving signal generating circuit DG utilizing dummy bit lines.

Referring now to FIG. 5, the dummy bit lines are described. In FIG. 5, a schematic structure of a single block, for example, only a block #1 is illustrated. A plurality of word lines WL are arranged parallel to each other in memory cell arrays MA formed in regions on both sides of a column decoder CD. A plurality of pairs of bit lines BL and $\overline{BL}$ are arranged to intersect perpendicularly with the word lines WL. Dummy bit lines $DBL_0$ are arranged outside the outermost bit lines, of the bit line pairs BL and $\overline{BL}$. Since other bit lines are not inherently located outside the outermost bit lines, symmetry of the circuit is not held in the bit lines. Therefore, the above described dummy bit lines $DBL_0$ are provided so that symmetry or the like of the circuit is held.

According to the present embodiment, one of the dummy bit lines $DBL_0$ provided in blocks #1 and #3 and one of the dummy bit lines $DBL_1$ provided in blocks #2 and #4 are used.

In FIG. 6, a restore circuit RS comprises two P channel MOSFETs Q1 and Q2 and a common node line $S_{2p0}$ (or $S_{2p1}$). It is assumed that the common node line in the blocks #1 and #3 is $S_{2p0}$ and the common node line in the blocks #2 and #4 is $S_{2p1}$. The MOSFET Q1 is connected between a bit line BL and the common node line $S_{2p0}$ (or $S_{2p1}$). The MOSFET Q1 has a gate connected to a bit line $\overline{BL}$. The MOSFET Q2 is connected between the bit line $\overline{BL}$ and the common node line $S_{2p0}$ (or $S_{2p1}$). The MOSFET Q2 has a gate connected to the bit line BL. The common node line $S_{2p0}$ (or $S_{2p1}$) is connected to a power-supply potential Vcc through a P channel MOSFET 3. The MOSFET 3 has a gate receiving the restore circuit driving signal $\overline{\Phi_{S0}}$ (or $\overline{\Phi_{S1}}$). The restore circuit driving signal $\overline{\Phi_{S0}}$ is applied to blocks selected when a row address RA9 equals 0, that is, the blocks #1 and #3. On the other hand, the restore circuit driving signal $\overline{\Phi_{S1}}$ is applied to blocks selected when the row address RA9 equals 1, that is, the blocks #2 and #4.

Figure 7:
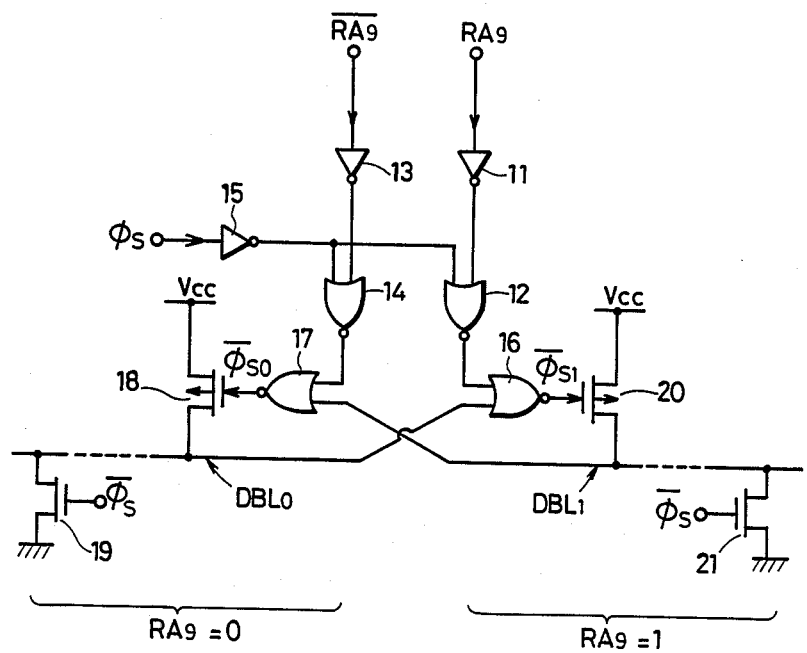
FIG. 7 is a diagram showing an example of a circuit structure for generating two restore circuit driving signals at an interval of time period.

FIG. 7 is a diagram showing an example of the driving signal generating circuit DG for generating the restore circuit driving signals $\overline{\Phi_{S0}}$ and $\overline{\Phi_{S1}}$.

The row address signal RA9 is applied to one input of an NOR gate 12 through an inverter 11. An inverted signal $\overline{RA9}$ of the row address signal RA9 is applied to one input of an NOR gate 14 through an inverter 13. Each of the NOR gates 12 and 14 has other input receiving the sense amplifier driving signal $\Phi_S$ through an inverter 15. An output of the NOR gate 12 is applied to one input of an NOR gate 16. The NOR gate 16 has other input receiving the potential on a first dummy bit line $DBL_0$. In addition, an output of the NOR gate 14 is applied to one input of an NOR gate 17. The NOR gate 17 has other input receiving the potential on a second dummy bit line $DBL_1$.

The first dummy bit line $DBL_0$ is connected to a power supply potential through a P channel MOSFET 18 and connected to a ground through an N channel MOSFET 19. Furthermore, the second dummy bit line $DBL_1$ is connected to the power supply potential through a P channel MOSFET 20 and connected to a ground through an N channel MOSFET 21. The FET 20 has a gate electrode receiving an output of the NOR gate 16, and the FET 18 has a gate electrode receiving an output of the NOR gate 17. In addition, each of the FETs 19 and 21 has a gate receiving an inverted signal $\overline{\Phi_S}$ of the sense amplifier driving signal $\Phi_S$.

Description is now made on operation of the circuit shown in FIG. 7.

It is assumed that the row address signal RA9 equals 0, that is, the blocks #1 and #3 are selected as blocks where data are to be inputted or outputted.

When the sense amplifier driving signal $\Phi_S$ is at an "L" level, the inverted signal $\overline{\Phi_S}$ is at an "H" level, so that the FETs 19 and 21 are turned on and the dummy bit lines $DBL_0$ and $DBL_1$ are at a ground potential. At that time, since a signal at the "H" level which is an inverted signal of the sense amplifier driving signal $\Phi_S$ at the "L" level is applied to one input of the NOR gates 12 and 14, the outputs of the NOR gates 12 and 14 attain the "L" level. Thus, since the outputs at the "L" level of the NOR gates 12 and 14 and the potentials at the "L" level on the dummy bit lines $DBL_0$ and $DBL_1$ are applied to the NOR gates 16 and 17, the restore circuit driving signal $\overline{\Phi_{S1}}$ and $\overline{\Phi_{S0}}$ at the "H" level are outputted from the NOR gates 12 and 14.

When the sense amplifier driving signal $\Phi_S$ rises to the "H" level, a signal at the "L" level which is inverted by the inverter 15 is applied to one input of each of the NOR gates 12 and 14. At that time, since $\overline{RA9}$ equals 1 and the signal at the "L" level is applied to the other input of the NOR gate 14, the output of the NOR gate 14 attains the "H" level. Accordingly, the restore circuit driving signal $\overline{\Phi_{S0}}$ outputted from the NOR gate 17 falls to the "L" level. Therefore, the FET 18 is turned on, so that the potential on the first dummy bit line $DBL_0$ is pulled up to the power-supply potential. Accordingly, the restore circuit driving signal $\overline{\Phi_{S1}}$ outputted from the NOR gate 16 falls to the "L" level.

In the above described manner, the restore circuit driving signal $\overline{\Phi_{S0}}$ in the selected blocks #1 and #3 falls and then, the restore circuit driving signal $\overline{\Phi_{S1}}$ in the non-selected blocks #2 and #4 falls after some delay.

Contrary to this, if and when the row address signal RA9 equals 1, that is, the blocks #2 and #4 are selected as blocks where data are inputted or outputted, the restore circuit driving signal $\overline{\Phi_{S1}}$ in the blocks #2 and #4 falls and then, the restore circuit driving signal $\overline{\Phi_{S0}}$ in the blocks #1 and #3 falls after some delay.

Figure 8:
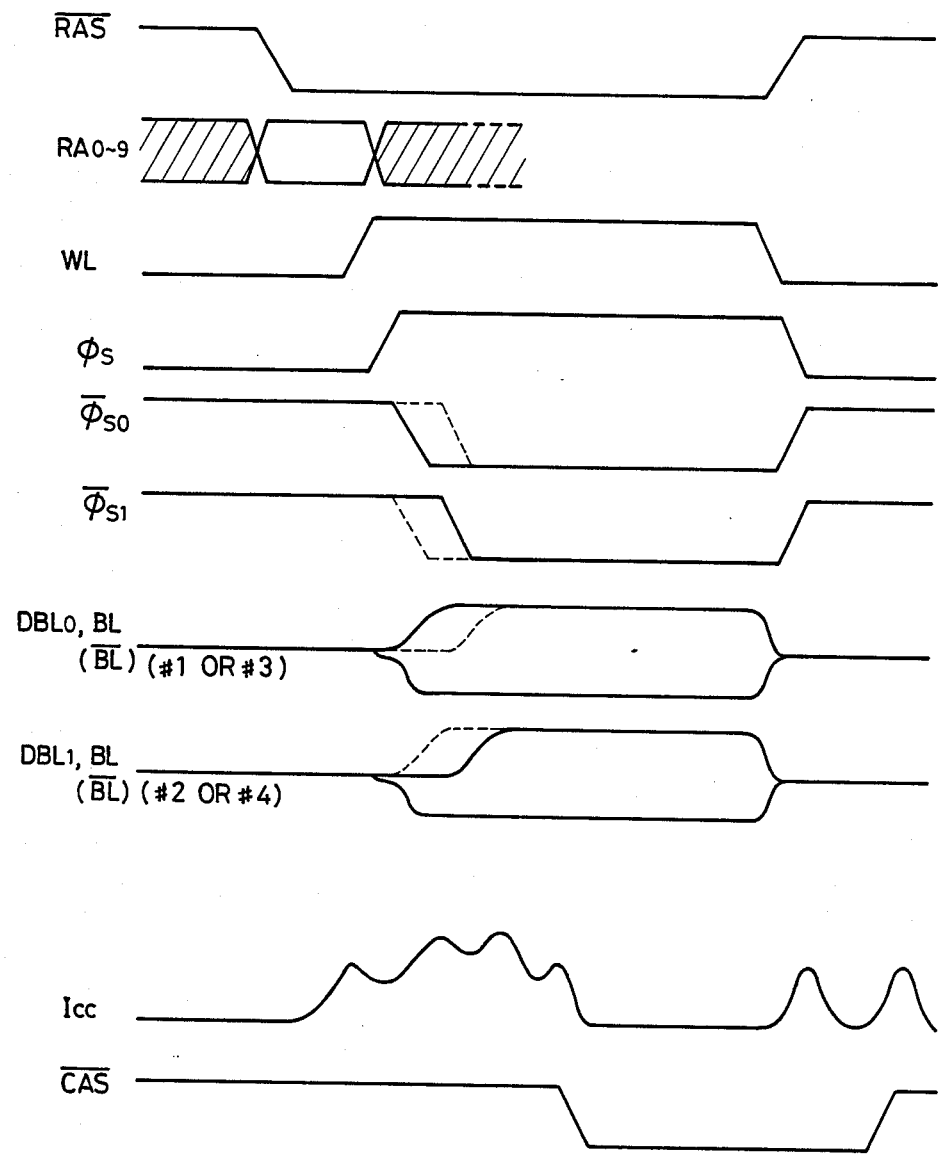
FIG. 8 is a timing chart for explaining operation of the embodiment shown in FIGS. 4 to 7.

FIG. 8 is a timing chart for explaining operation according to the embodiment shown in FIGS. 4 to 7. Referring now to FIG. 8, description is made on operation of the above described embodiment.

It is assumed that the row address signal RA9 equals 0 (illustrated by solid lines in FIG. 8), that is, the blocks #1 and #3 are selected as blocks where data are to be inputted or outputted. In this case, a row address strobe signal $\overline{RAS}$ falls and then, a word line selected by row addresses RA0 to RA8 rises in the blocks #1 to #4. Thereafter, the sense amplifier driving signal $\Phi_S$ rises so that sensing operation is performed in the blocks #1 to #4 and then, the restore circuit driving signal $\overline{\Phi_{S0}}$ falls. Therefore, restoring operation is performed in the blocks #1 and #3, so that the potential on the bit line at a high level is pulled up to the potential of Vcc. At the same time, the dummy bit line $DBL_0$ provided in an end of the block is pulled up. On the other hand, the blocks #2 and #4 which are not selected as blocks where data are to be inputted or outputted wait, while the potential on the bit line at a low level is pulled down to the ground potential by sensing operation. The restore circuit driving signal $\overline{\Phi_{S1}}$ falls in response to the rise of the dummy bit line $DBL_0$ in the above described selected block. More specifically, the restore circuit driving signal $\overline{\Phi_{S1}}$ falls after some delay from the restore circuit driving signal $\overline{\Phi_{S0}}$, so that restoring operation is performed in the non-selected blocks #2 and #4.

It is assumed that the row address signal RA9 equals 1 (as illustrated by dotted lines in FIG. 8), that is, the blocks #2 and #4 are selected as blocks where data are to be inputted or outputted. In this case, contrary to this, restoring operation is performed in the selected blocks #2 and #4 after sensing operation, and restoring operation is performed in the non-selected blocks #1 and #3 after the rise of the dummy bit line $DBL_1$ in the selected blocks #2 and #4 (a waveform represented by a dotted line in FIG. 8).

Thus, since the block corresponding to RA9=0 and the block corresponding to RA9=1 are operated for restoring at different timing with a predetermined time difference, circuit operation which may cause peak current consumption can be internally performed with an interval. As a result, the peak value of the consumed current Icc can be decreased, as shown in FIG. 8.

When, for example, RA9 equals 0, only refreshing operation is performed and data is not inputted to or outputted from the exterior in the blocks (the blocks #2 and #4) corresponding to RA9=1. If sensing operation is not followed by restoring operation, the access time, the timing for writing data or the like are not affected even if operation in the blocks is delayed.

Figure 9:
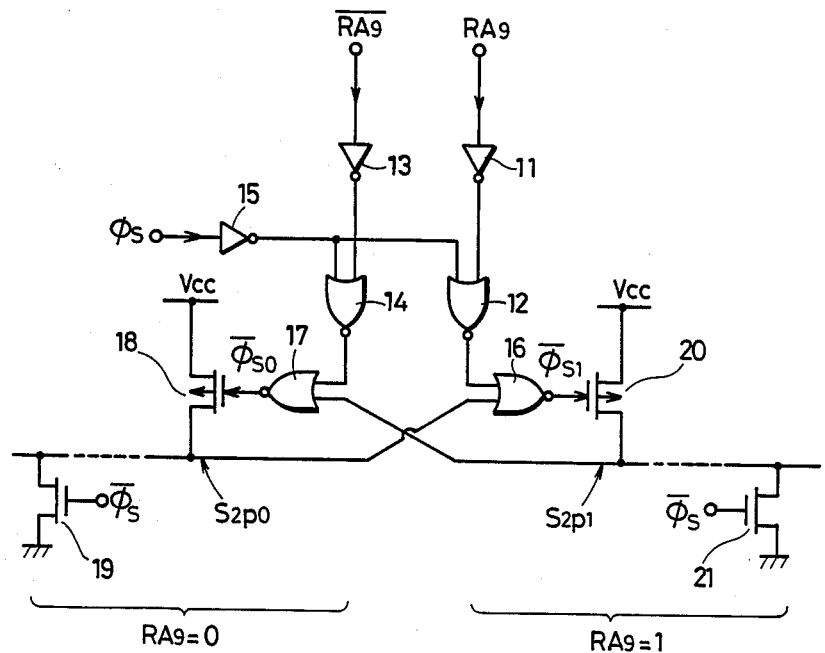
FIG. 9 is a diagram showing another example of a circuit structure for generating two restore circuit driving signals at an interval of time period.

FIG. 9 is a diagram showing another example of the driving signal generating circuit DG for generating the restore circuit driving signals $\overline{\Phi_{S0}}$ and $\overline{\Phi_{S1}}$.

Figure 10:
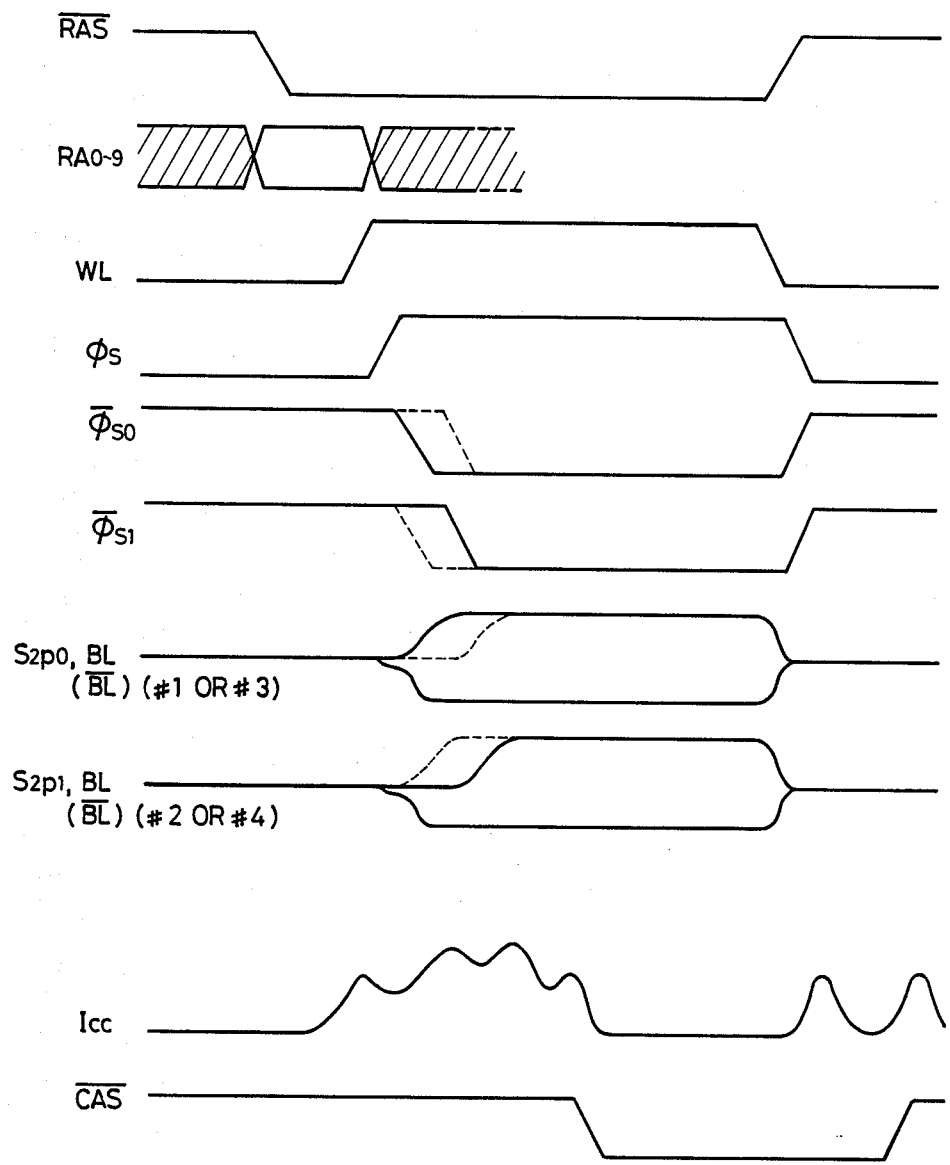
FIG. 10 is a timing chart for explaining operation of another embodiment shown in FIG. 9.

The circuit shown in FIG. 9 differs from the circuit shown in FIG. 7 in that the dummy bit lines $DBL_0$ and $DBL_1$ are replaced with one of the common node lines $S_{2p0}$ of a restoring system in the blocks #1 and #3 and one of the common node lines $S_{2p1}$ of a restoring system in the blocks #2 and #4. The other structure is the same as that in FIG. 7. FIG. 10 is a timing chart for explaining operation of the circuit shown in FIG. 9. FIG. 10 is the same as FIG. 8 except that the potentials on the dummy bit lines $DBL_0$ and $DBL_1$ are replaced with potentials on the common node lines $S_{2p0}$ and $S_{2p1}$. Thus, the block corresponding to RA9=0 and the block corresponding to RA9=1 are also operated for restoring at different timing with a predetermined time difference by the circuit shown in FIG. 9. As a result, the peak value of the consumed current Icc is decreased, as shown in FIG. 10.

The present invention is not limited to a structure of the memory cell array block illustrated as described above. The present invention can be generally applied to all of structures in which there exist a block selected by a row address for performing operation and a non-selected block for performing only refreshing operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of word lines,
   a plurality of pairs of bit lines intersecting with said plurality of word lines,
   a plurality of memory cells located at intersections of said word lines and said bit lines, said plurality of memory cells being divided into a plurality of blocks,
   a sense amplifier for amplifying voltage between each of said bit line pairs,
   restoring means for further amplifying the voltage between each of said bit line pairs,
   block selecting means for generating a block selecting signal for selecting said blocks and a block non-selecting signal,
   sense amplifier driving means for generating a sense amplifier driving signal for operating said sense amplifier,
   restore driving means for generating a restore driving signal for operating said restoring means after generation of said sense amplifier driving signal, and
   a pair of signal lines, said restore driving means comprising
  first generating means responsive to said sense amplifier driving signal, said block selecting signal and a potential on one signal line of said signal lines for generating a first restore driving signal for operating the restoring means in a block designated by said block selecting signal,
  first signal line driving means responsive to said first restore driving signal for driving the other signal line of said signal lines,
  second generating means responsive to said sense amplifier driving signal, said block non-selecting signal and a potential on the other signal line of said signal lines for generating a second restore driving signal for operating the restoring means in a block designated by said block non-selecting signal, and
  second signal line driving means responsive to said second restore driving signal for driving one signal line of said signal lines.

2. A semiconductor memory device according to claim 1, which further comprises dummy bit lines provided outside the outermost bit lines in each of said blocks, said pair of signal lines comprising one of said dummy bit lines in a block designated by said selecting signal and one of said dummy bit lines in a block designated by said non-selecting signal.

3. A semiconductor memory device according to claim 1, wherein each of said restoring means comprises a restore driving signal line receiving said restore driving signal from said restore driving means, and said pair of signal lines comprises said restore driving signal line of said restoring means in the block designated by said selecting signal and said restore driving signal line of said restoring means in the block designated by said non-selecting signal.

4. A semiconductor memory device according to claim 1, wherein
  said restore driving means further comprises a first potential source for generating a first potential and a second potential source for generating a second potential,
  said first generating means comprises
    first logical gate means comprising one input terminal coupled to receive said sense amplifier driving signal, another input terminal coupled to receive said block selecting signal and an output terminal for deriving an output signal at a predetermined logical level if logical levels of the one input terminal and said another input terminal become a predetermined level, and
    second logical gate means comprising one input terminal coupled to receive said output signal from said first logical gate means, another input terminal coupled to receive a potential on one of said signal lines and an output terminal for deriving said first restore driving signal at a predetermined logical level if logical levels of said one input terminal and said another input terminal become a predetermined level,
  said first signal line driving means comprises
    first switching means connected between said first potential source and another one of said signal lines and comprising a control terminal coupled to receive said first restore driving signal from said second logical gate means, and
    second switching means connected between said second potential source and said another one of said signal lines and comprising a control terminal coupled to receive said sense amplifier driving signal,
  said second generating means comprises coupled to receive said sense amplifier driving signal, another input terminal coupled to receive said block non-selecting signal and an output terminal for deriving an output signal at a predetermined logical level if the logical levels of the one input terminal and said another input terminal become a predetermined level, and
    fourth logical gate means comprising one input terminal coupled to receive said output signal from said third logical gate means, another input terminal coupled to receive a potential of said another one of said signal lines and an output terminal for deriving said second restore driving signal at a predetermined logical level if the logical levels of said one input terminal and said another input terminal become a predetermined level,
  said second signal line driving means comprises
    third switching means connected between said first potential source and one of said signal lines and comprising a control terminal coupled to receive said second restore driving signal from said fourth logical gate means, and
    fourth switching means connected between said second potential source and one of said signal lines and comprising a control terminal coupled to receive said sense amplifier driving signal.

5. A semiconductor memory device according to claim 4, wherein
  said first, second, third and fourth logical gate means comprise NOR gate means, and
  said first, second, third and fourth switching means comprise an MOS field effect transistor.

6. A semiconductor memory device according to claim 4, which further comprises dummy bit lines provided outside the outermost bit lines in each of said blocks, said pair of signal lines comprising one of said dummy bit lines in a block designated by said selecting signal and one of said dummy bit lines in a block designated by said non-selecting signal.

7. A semiconductor memory device according to claim 4, wherein each of said restoring means comprises a restore driving signal line receiving said restore driving signal from said restore driving means, and said pair of signal lines comprises said restore driving signal line of said restoring means in the block designated by said selecting signal and said restore driving signal line of said restoring means in the block designated by said non-selecting signal.

8. In a semiconductor memory device comprising:
  a plurality of word lines,
  a plurality of pairs of bit lines intersecting with said plurality of word lines,
  a plurality of memory cells located at intersections of said word lines and said bit lines, said plurality of memory cells being divided into a plurality of blocks,
  a sense amplifier for amplifying voltage between each of said bit line pairs,
  restoring means for further amplifying the voltage between each of said bit line pairs,
  block selecting means for generating a block selecting signal for selecting said blocks and a block non-selecting signal, sense amplifier driving means for generating a sense amplifier driving signal for operating said sense amplifier, restore driving means for generating a restore driving signal for operating said restoring means after generation of said sense amplifier driving signal, and a pair of signal lines, a method of driving said restoring means comprising:

in response to said sense amplifier driving signal, said block selecting signal and the potential on one signal line of said signal lines, generating a first restore driving signal for operating the restoring means in a block designated by said block selecting signal, in response to said first restore driving signal, driving the other signal line of said signal lines, in response to said sense amplifier driving signal, said block non-selecting signal and the potential on the other signal line of said signal lines, generating a second restore driving signal for operating the restoring means in a block designated by said block non-selecting signal, and in response to said second restore driving signal, driving one signal line of said signal lines.

* * * * *